United States Patent
Gu et al.

(10) Patent No.: US 11,951,730 B2
(45) Date of Patent: Apr. 9, 2024

(54) FLEXIBLE DISPLAY DEVICE, BACK FILM FOR A FLEXIBLE DISPLAY DEVICE AND PREPARATION METHOD THEREOF

(71) Applicant: BOE TECHNOLOGY GROUP CO., LTD., Beijing (CN)

(72) Inventors: Penghao Gu, Beijing (CN); Chunyan Xie, Beijing (CN); Song Zhang, Beijing (CN); Ziang Han, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 457 days.

(21) Appl. No.: 17/309,517

(22) PCT Filed: Dec. 29, 2020

(86) PCT No.: PCT/CN2020/140842
§ 371 (c)(1),
(2) Date: Jun. 3, 2021

(87) PCT Pub. No.: WO2021/136269
PCT Pub. Date: Jul. 8, 2021

(65) Prior Publication Data
US 2022/0314578 A1 Oct. 6, 2022

(30) Foreign Application Priority Data

Jan. 3, 2020 (CN) .......................... 202010008753.2

(51) Int. Cl.
*B32B 7/06* (2019.01)
*B32B 3/16* (2006.01)
(Continued)

(52) U.S. Cl.
CPC .................. *B32B 7/06* (2013.01); *B32B 3/16* (2013.01); *B32B 7/14* (2013.01); *B32B 15/18* (2013.01);
(Continued)

(58) Field of Classification Search
CPC .... B32B 7/06; B32B 3/16; B32B 7/14; B32B 15/18; B32B 27/281; B32B 27/36;
(Continued)

(56) References Cited

U.S. PATENT DOCUMENTS 7,170,481 B2 * 1/2007 Doane ............... G02F 1/133305
345/87
9,747,825 B2  8/2017 Kim
(Continued)

FOREIGN PATENT DOCUMENTS

CN    106775043 A    5/2017
CN    107195642 A    9/2017
(Continued)

OTHER PUBLICATIONS

First Chinese Office Action dated Feb. 1, 2021, received for corresponding Chinese Application No. 202010008753.2, 18 pages.
(Continued)

*Primary Examiner* — Patricia L. Nordmeyer
(74) *Attorney, Agent, or Firm* — Kinney & Lange, P.A.

(57) ABSTRACT

The present disclosure provides a flexible display device. The flexible display device has different base materials for the back supporting film at the bonding region and the non-bonding region, so that it can satisfy the requirements for AOI and bending resistance respectively. The present disclosure also provides a back film for a flexible display device and a preparation method thereof.

11 Claims, 3 Drawing Sheets

(51) Int. Cl.
*B32B 7/14* (2006.01)
*B32B 15/18* (2006.01)
*B32B 27/28* (2006.01)
*B32B 27/36* (2006.01)
*B32B 37/02* (2006.01)
*B32B 37/12* (2006.01)
*B32B 37/18* (2006.01)
*B32B 38/10* (2006.01)

(52) U.S. Cl.
CPC ............ *B32B 27/281* (2013.01); *B32B 27/36* (2013.01); *B32B 37/02* (2013.01); *B32B 37/1292* (2013.01); *B32B 37/182* (2013.01); *B32B 38/10* (2013.01); *B32B 2255/10* (2013.01); *B32B 2255/26* (2013.01); *B32B 2307/308* (2013.01); *B32B 2307/412* (2013.01); *B32B 2307/54* (2013.01); *B32B 2307/546* (2013.01); *B32B 2311/30* (2013.01); *B32B 2367/00* (2013.01); *B32B 2379/08* (2013.01); *B32B 2457/20* (2013.01)

(58) Field of Classification Search
CPC ... B32B 37/02; B32B 37/1292; B32B 37/182; B32B 38/10; B32B 2255/10; B32B 2255/26; B32B 2307/308; B32B 2307/412; B32B 2307/54; B32B 2307/546; B32B 2311/30; B32B 2367/00; B32B 2379/08; B32B 2457/20; H10K 50/844; H10K 77/111; G09F 9/301
See application file for complete search history.

(56) References Cited

U.S. PATENT DOCUMENTS

| | | |
|---|---|---|
| 2013/0088251 A1 | 4/2013 | Choi et al. |
| 2017/0317264 A1 | 11/2017 | Tomiyoshi |
| 2020/0004077 A1 | 1/2020 | Lee et al. |
| 2022/0376205 A1* | 11/2022 | Gu ................ H10K 50/841 |

FOREIGN PATENT DOCUMENTS

| | | |
|---|---|---|
| CN | 107464887 A | 12/2017 |
| CN | 107665854 A | 2/2018 |
| CN | 108182879 A | 6/2018 |
| CN | 108598263 A | 9/2018 |
| CN | 108920012 A | 11/2018 |
| CN | 109461374 A | 3/2019 |
| CN | 110429108 A | 11/2019 |
| CN | 110564319 A | 12/2019 |
| CN | 111179757 A | 5/2020 |
| CN | 111187576 A | 5/2020 |
| EP | 3255482 B1 | 8/2021 |
| JP | 2017201782 A | 11/2017 |

OTHER PUBLICATIONS

Second Chinese Office Action dated Jun. 18, 2021, received for corresponding Chinese Application No. 202010008753.2, 16 pages.

* cited by examiner

FLEXIBLE DISPLAY DEVICE, BACK FILM FOR A FLEXIBLE DISPLAY DEVICE AND PREPARATION METHOD THEREOF

CROSS REFERENCE TO RELATED APPLICATION(S)

This application is a Section 371 National Stage Application of International Application No. PCT/CN2020/140842, filed Dec. 29, 2020, entitled "FLEXIBLE DISPLAY DEVICE, BACK FILM FOR A FLEXIBLE DISPLAY DEVICE AND PREPARATION METHOD THEREOF", which in turn claims a priority of Chinese Patent Application No. 202010008753.2, filed on Jan. 3, 2020, which are incorporated herein by reference in their entireties.

TECHNICAL FIELD

The present disclosure relates to the technical field of flexible display, and in particular to a flexible display device, a back film for a flexible display device and a preparation method thereof.

BACKGROUND

A flexible display device typically comprises a flexible display panel and a back supporting film or back protective film bound to a back surface thereof. The flexible display panel typically comprises film layer structures such as an encapsulation film layer, a light emitting film layer, a backplane film layer, and a flexible substrate. All these film layers are supported and protected by the back supporting film attached to the entire back surface of the flexible display panel. In view of the mechanical properties, the thickness of the back supporting film is generally much greater than that of the flexible display panel. Therefore, when the flexible display device is bent, the bending recovery performance, the breaking strength, the deformation capability and the like of the thickest back supporting film will directly influence the overall bending performance of the panel attached thereon.

There is a need for improving the back supporting film of the flexible display device.

SUMMARY

In one aspect, the present disclosure provides a flexible display device, comprising a flexible display panel and a back supporting film bound to a back surface of the flexible display panel, wherein the flexible display panel comprises a bonding region and a non-bonding region, wherein
the back supporting film comprises: a first base material layer bound to the flexible display panel in at least a portion of the bonding region, and a second base material layer bound to the flexible display panel in at least a portion of the non-bonding region,
wherein the first base material layer is bound to the flexible display panel via a transparent first adhesive layer, the first base material layer has a transmittance of 85% or more and a haze of 5% or less, and
wherein the second base material layer is bound to the flexible display panel via a second adhesive layer, wherein the second base material is different from the first base material.

Optionally, the second base material has an elastic modulus and/or a breaking strength greater than those of the first base material.

Optionally, the second base material layer has an unrecoverable angle after being folded in half of 60° or less.

Optionally, the second base material layer has a transmittance of less than 85% and a haze of more than 5%.

Optionally, the first base material has a glass transition temperature of 150° C. or higher.

Optionally, the first base material is polyethylene terephthalate, and the second base material is polyimide or stainless steel.

Optionally, the first adhesive has an elastic modulus greater than that of the second adhesive.

In another aspect, the present disclosure provides a back film for a flexible display device, comprising:
a release layer; and
a first base layer bounded on the release layer via a transparent first adhesive layer, and a second base layer bounded on the release layer via a second adhesive layer, wherein there is a gap between orthographic projections of the first base material layer and the second base material layer on the release layer;
wherein,
the first base material layer has a transmittance of 85% or more and a haze of 5% or less; and
the second base material is different from the first base material.

Optionally, the second base material has an elastic modulus and/or a breaking strength greater than those of the first base material.

Optionally, the second base material layer has an unrecoverable angle after being folded in half of 60° or less.

Optionally, the second base material layer has a transmittance of less than 85% and a haze of more than 5%.

Optionally, the first base material has a glass transition temperature of 150° C. or higher.

Optionally, the first base material is polyethylene terephthalate, and the second base material is polyimide or stainless steel.

In yet another aspect, the present disclosure provides a preparation method of the back film of the present disclosure, comprising:
positioning the first base material and the second base material on a carrier film, so that there is an empty region remained between the first base material and the second base material, wherein the empty region has a width less than that of the gap;
overlaying the first adhesive and the second adhesive on the first base material and the second material with respectively to form the adhesive layers;
overlaying the release layer on the adhesive layers;
removing the carrier film; and
cutting off the first base material and/or the second base material at an edge of the empty region to form the gap.

DETAILED DESCRIPTION

With developments of flexible display screens at present, the desire for foldable display products are increasingly higher. Polyethylene terephthalate (PET) is used as a base material for the back supporting film in many flexible display devices. Both the elastic modulus and the breaking strength of the PET material are not high. This results in limited deformation resistance and resilience when it is used as a back supporting film. Unrecoverable creases are formed in conventional PET materials when they are bent at a large angle, and the unrecoverable angle after being folded in half is typically 120° or more, or in other words, differs from the angle in the initial flat position by 120° or more. Further, although the PET material has a relatively large elongation at break, there is still a risk of fracture when the bending radius is relatively small. Therefore, it is taken into account to select and use other materials with higher elastic modulus and/or breaking strength as the base material for the back supporting film attached to the entire surface.

However, the advantages of the PET base material also include good transparency, i.e., high transmittance, which is close to 90%, while having substantially no haze and black dot. This is particularly advantageous in the production of flexible substrates, because such transparent supporting films is convenient for observing electronic circuits in the bonding region of the display panel therethrough, so that the automatic optic inspection (AOI) can be successfully performed. Other materials with a high elastic modulus and/or breaking strength as described above typically have a poor transparency, and are all difficult to satisfy the requirements for clearly observing the bonding region and determining the indentation during the AOI.

Figure 1:
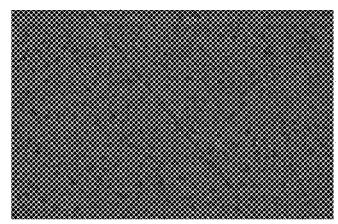
FIG. 1 shows the black dots in the back supporting film prepared from a polyimide material.

In flexible display devices, a general back supporting film is always composed of a single base material. The polyethylene terephthalate (PET) base material is advantageous for performing the AOI in the industrial production of a product, but it has insufficient deformation resistance and resilience. Other materials with high elastic modulus and/or breaking strength have poor transparency, and have more haze or black dots. FIG. 1 shows the appearance of a polyimide (PI) material with a relatively high bending resistance. As can be seen, there are a large number of black dots, which will significantly influence the AOI.

The present disclosure proposes a flexible display device in which the back supporting film comprises two different kinds of base materials in order to solve the technical problem as described above.

The present disclosure proposes a flexible display device, comprising a flexible display panel and a back supporting film bound to a back surface of the flexible display panel, wherein the flexible display panel comprises a bonding region and a non-bonding region; wherein the back supporting film comprises: a first base material layer bound to the flexible display panel in at least a portion of the bonding region, and a second base material layer bound to the flexible display panel in at least a portion of the non-bonding region, wherein the first base material layer is bound to the flexible display panel via a transparent first adhesive layer, and the first base material layer has a transmittance of 85% or more and a haze of 5% or less; and wherein the second base material layer is bound to the flexible display panel via a second adhesive layer, wherein the second base material is different from the first base material.

As described above, in existed flexible display devices, a back supporting film is always composed of a single base material in various regions of the display panel. Currently, in conventional economical materials, there are rare flexible materials with high transparency and high uniformity as well as relatively high bending resistance and relatively high resilience. Therefore, the use of single conventional base material cannot meet the performance requirements of the back supporting film for various regions. The present disclosure proposes a technical solution where the back supporting film is regionally designed for different regions of the display panel.

In the present disclosure, different materials are used for the first base material and the second base material, so that different desired properties can be provided in different regions. A transparent material having a transmittance of 85% or more and a haze of 5% or less is used for the first base material layer. The first base material layer has a good transparency and a low haze, and therefore can be used for the AOI in the bonding region of the display panel, and can completely meet the requirements for clearly observing the bonding region and determining the indentation during the AOI. Of course, as the base material for the back supporting film of the flexible display device, the first base material layer also needs to have sufficient flexibility, appropriate bending resistance and resilience. Nevertheless, since the first base material layer is completely or mainly provided in the bonding region which requires relatively low bending resistance, and the bonding region is typically located at the frame of the flexible display device, insufficient bending resistance and resilience of the first base material layer substantially have no adverse effect on the display area of the flexible display device. Preferably, the first base material has a glass transition temperature Tg of 150° C. or higher, so that it can withstand the temperature of the thermal treatment in processes for the bonding region.

The second base material is different from the first base material. The properties of the second base material should meet the requirements in the non-bonding region as much as possible. The second base material should provide sufficient flexibility, good bending resistance and resilience. The bending resistance and resilience are overall properties influenced by factors such as the material, the microstructure and the size of the base material layer, and are difficult to be defined by a single physical parameter. In an embodiment, the second base material may have higher elastic modulus and/or breaking strength higher than the first base material. When the base material layer has higher elastic modulus and/or breaking strength, the bending resistance and resilience are typically better. The second base material may have much higher elastic modulus and/or breaking strength much higher than the first base material or close to the first base material. Further, in the present disclosure, one or both of elastic modulus and breaking strength of the second base material may be even lower than the first base material, as long as the bending resistance and resilience of the second base material layer in the non-bonding region are better than the first base material layer. For example, the second base material layer can also achieve better bending resistance and resilience by having different thickness or microstructure from the first base material layer. Nevertheless, it is typically preferred that the second base material has elastic modulus and/or breaking strength higher than the first base material.

In an embodiment, the second base material has elastic modulus and/or breaking strength close to the first base material. In an embodiment, the first base material has an elastic modulus in a range from 2 GPa to 6 GPa and a breaking strength in a range from 100 MPa to 400 MPa, preferably has an elastic modulus in a range from 2 to 4 GPa and a breaking strength in a range from 100 to 300 MPa; and the second base material has an elastic modulus in a range from 2 GPa to 10 GPa, and a breaking strength in a range from 100 MPa to 400 MPa, such as in a range from 140 to 400 M, such as in a range from 140 MPa to 200 MPa. In an embodiment, the first base material is PET, and the second base material is PI.

In an embodiment, the second base material has elastic modulus and breaking strength much higher than the first base material. In an embodiment, the first base material has an elastic modulus in a range from 2 GPa to 6 GPa and a breaking strength in a range from 100 MPa to 400 MPa, preferably has an elastic modulus in a range from 2 to 4 GPa and a breaking strength in a range from 100 to 300 MPa; and the second base material has an elastic modulus in a range from 150 GPa to 300 GPa, and a breaking strength of 1400 MPa or more, such as in a range from 1500 MPa to 2000 MPa. In an embodiment, the first base material is PET, and the second base material is stainless steel (SUS).

In an embodiment, the second base material layer has an unrecoverable angle after being folded in half of 60° or less. The unrecoverable angle after being folded in half refers to an angle measured as follows. A film-like material sample is positioned on a horizontal plane, and folded in half, so that an upper surface on one side of the crease is turned over and contacted with an upper surface on the other side of the crease. Subsequently, the external force is withdrawn, so that the folded side rebounds. After the rebounding, an angle between the folded side and its initial horizontal position is considered as the unrecoverable angle after being folded in half. In this case, as compared with a PET material with an unrecoverable angle after being folded in half of 120° or more, the second base material layer of the present disclosure has much higher bending resistance and resilience. In addition, the second base material layer may have a transmittance of less than 85% and a haze of more than 5%. Since the second base material layer is completely or mainly disposed in the non-bonding region which does not require transparency at all, it may be translucent or opaque. This is an important advantage of the present disclosure, because it significantly expands the choices of the second base material. In addition, since the second base material does not need to be capable of withstanding the temperature of the thermal treatment in the bonding region process, the glass transition temperature Tg thereof does not need to be 150° C. or higher. For example, 60° C. or higher may be sufficient. This is also an important advantage of the present disclosure, because it also significantly expands the choices of the second base material.

The display panel of the present disclosure refers to a display device which has not yet been bound to a back supporting film. Generally, it may comprise film layer structures such as an encapsulation film layer, a light emitting film layer, a backplane film layer, and a flexible substrate, and may comprise a bonding region and a non-bonding region. In the present disclosure, conventional flexible display panels to be bound to a back supporting film may be used.

Thus, the present disclosure proposes a flexible display device, in which a base material for a back supporting film on at least a portion of a bonding region is a first base material, and a portion or all of a base material for the back supporting film on a non-bonding region is a second base material. The first base material is different from the second base material. In the transverse direction (that is a direction in parallel to the flexible display panel), there may be a gap between the first base material and the second base material. The gap is located in the bonding region and may be used for folding the bonding region to narrow the frame. The first base material and the second base material may be disposed in the same layer. Such a back supporting film can have both excellent bending resistance and resilience in the non-bonding region and high transparency and low haze in the bonding region to fit the AOI.

As described above, in addition to a transmittance of 85% or more and a haze of 5% or less, the first base material should also have appropriate bending resistance and resilience. Furthermore, the first base material should have sufficient glass transition temperature to withstand the temperature of the thermal treatment in the bonding region. Since the requirements for the bending resistance and the resilience are not very high, the first base material may have the following properties: an elastic modulus in a range from 2 GPa to 6 GPa, and a breaking strength in a range from 100 MPa to 400 MPa, preferably an elastic modulus in a range from 2 to 4 GPa and a breaking strength in a range from 100 to 300 MPa; and an elongation at break of 60%-80%. Preferably, the first base material is PET. PET has a high transmittance, close to 90%. Meanwhile, this base material has good quality and very low haze; substantially has no black dot; has a glass transition temperature of 150° C. or higher; and it is inexpensive. Therefore, PET is suitable for processes such as bonding. Furthermore, PET has an elastic modulus substantially in a range from 2 to 4 GPa, typically around 2 GPa, and a breaking strength of around 115 MPa. It can meet the basic requirements for a back supporting film.

The second base material is mainly selected from materials with high bending resistance and good resilience. The requirements for transmittance and haze can be relatively relaxed, and even the second base material may be further selected from opaque materials. Furthermore, the requirement for glass transition temperature for the second base material is also relatively low, and generally, the glass transition temperature only needs to be 60° C. or higher. Available materials comprise polymer base materials. Polymer base materials may have the following properties: an elastic modulus in a range of 2 GPa to 10 GPa, such as in a range of 3 to 7 GPa; a breaking strength in a range of 100 MPa to 400 MPa, such as in a range of 140 to 400 MPa, such as in a range of 140 MPa to 200 MPa, for example≥170 MPa; an elongation at break of 5%-40%, preferably 10%-30%; a moisture absorption of 2% or less, preferably less than 1%; no requirements for transmittance, haze and black dot. Although the second base material will also be curved after being bent, and will also have unrecoverable crease, the unrecoverable angle after being folded in half thereof may be 60° or less. A preferred polymer material is polyimide. Available materials also comprise metal base materials. Metal base materials may have the following properties: an elastic modulus in a range of 150 GPa to 300 GPa; a breaking strength of 1400 MPa or more, such as in a range of 1500 MPa to 2000 MPa; an elongation at break of 30% or less; no requirements for transmittance, haze and black dot. A preferred metal material is SUS. The unrecoverable angle after being folded in half thereof may be 60° or less.

The second base material can provide excellent mechanical support and protection for the non-bonding region of the display panel.

All kinds of base materials must have sufficient bending resistance, and preferably can meet the requirement for 100K R5 dynamic bending. Meeting the requirement for 100K R5 dynamic bending means that the material will not break after repeated bending for 100000 (100K) times at a bending radius of 5 mm.

The first base material layer the second base material layer may have the same thickness. In this case, the adhesive layers also have the same thickness, so that the surfaces of the base materials for the back supporting film are positioned in the same plane. The same adhesive layers are advantageous for the preparation of a back film described below. Nevertheless, the first base material layer may also have a thickness different from that of the second base material layer, and accordingly the adhesive layers also have different thicknesses, making sure that the surfaces of the base materials are positioned in the same plane. Typically, the first base material layer and the second base material layer may have a thickness of 20 μm-80 μm.

The base material layers are bound to the back surface of the flexible display panel via adhesive layers. In the present disclosure, the adhesive layer between the first base material layer and the flexible display panel is referred to as a first adhesive layer, and the adhesive layer between the second base material layer and the flexible display panel is referred to as a second adhesive layer. Nevertheless, the same adhesive may be used for the first adhesive layer and the second adhesive layer. Of course, different adhesives may also be used. As required by the AOI, the first adhesive layer must be transparent. Nevertheless, the second adhesive layer may be opaque. For example, an opaque or translucent adhesive may be used for the second adhesive. This is because it is used in the non-bonding region, and will not influence the AOI. Further, the requirement for mechanical properties in the bonding region may be higher than in the non-bonding region. Preferably, the first adhesive has an elastic modulus greater than that of the second adhesive. For example, the first adhesive may have an elastic modulus of 150-500 kPa, while the second adhesive may have an elastic modulus of 1-150 kPa. Typically, the first adhesive layer and the second adhesive layer may have a thickness of 10 μm-50 μm.

The transparent first adhesive may be a common transparent adhesive, such as a transparent pressure-sensitive adhesive. The pressure-sensitive adhesive is advantageous for binding the back supporting film to the display panel. A preferred transparent adhesive is an acrylic adhesive material. The second adhesive may be the same as the first adhesive. The second adhesive may be a pressure-sensitive adhesive.

At least a portion of the bonding region is bound with the first base material layer, and at least a portion of the non-bonding region is bound with the second base material layer. That is, the bonding region needs to have a portion overlapped with the first base material layer, and the non-bonding region needs to have a portion overlapped with the second base material layer. In general, in the flexible display device of the present disclosure, the first base material layer is used for the bonding region, and the second base material layer is used for the non-bonding region. Nevertheless, there may also be a minor amount of the first base material in the non-bonding region, and there may also be a minor amount of the second base material in the bonding region, as long as the spirit of the present disclosure is satisfied. For example, an orthographic projection of the first base material layer on the display panel may have a portion in the non-bonding region, and an orthographic projection of the second base material layer on the display panel may have a portion in the bonding region.

There may be a gap between the first base material layer and the second base material layer, and a projection of the gap on the display panel is in the bonding region, so that the bonding region can be folded to narrow the frame.

Preferably, the entirety of the non-bonding region of the display panel is bound with the second base material layer. As such, display panel in the non-bonding region is supported and protected by the back supporting film with high bending resistance and high resilience. The back surface of the display panel in the bonding region has a portion without the back supporting film to facilitate the narrowing of the frame, and also has a highly transparent back supporting film to facilitate the AOI.

In another aspect, the present disclosure proposes a back film for a flexible display device, comprising:
  a release layer; and
  a first base layer bounded on the release layer via a transparent first adhesive layer, and a second base layer bounded on the release layer via a second adhesive layer, wherein there is a gap between orthographic projections of the first base material layer and the second base material layer on the release layer;
  wherein,
  the first base material layer has a transmittance of 85% or more and a haze of 5% or less; and
  the second base material is different from the first base material.

The back film of the present disclosure may be a separate product. The product may be produced, stored and transported separately, and may be bounded on the back surface of a flexible display panel as required to form a back supporting and protective film for the flexible display panel. In the back film, the base materials and the adhesives may be the same as those of the aforementioned flexible display device. For the convenience of preparation, the first adhesive and the second adhesive in the back film may be the same adhesive.

The back film of the present disclosure comprises a first base material used in a bonding region of a display panel and a second base material used in a non-bonding region of the display panel. Although the first base material and the second base material are separated apart from each other, they are connected via a release layer. In use, the release layer is peeled off to expose the first and second adhesive layers. The base materials are bounded on the back surface of a flexible display panel via adhesive layers respectively, so that the back surface-bound back supporting film in at least a portion of the bonding region comprises a first base material layer, and the back surface-bound back supporting film in at least a portion of the non-bonding region comprises a second base material layer. As such, the back supporting film can have both excellent bending resistance and resilience in the non-bonding region and high transparency and low haze in the bonding region to fit the AOI, and also has a gap to facilitate the folding of the bonding region and the narrowing of the frame. Further, as described above, the back film of the present disclosure may be produced, transported and stored as a separate product, which is very convenient.

Figure 2:
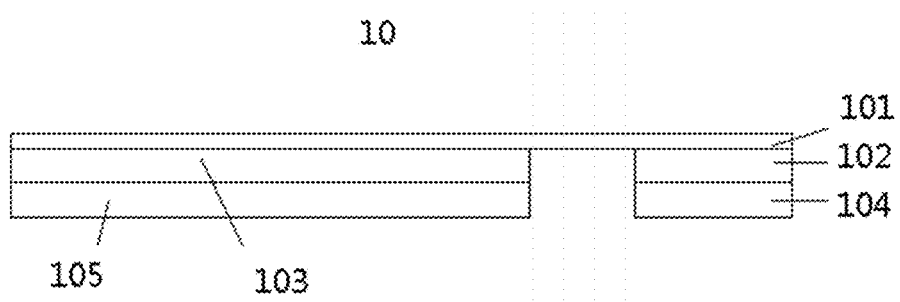
FIG. 2 shows an exemplary embodiment of a back film according to the present disclosure.
Figure 3:
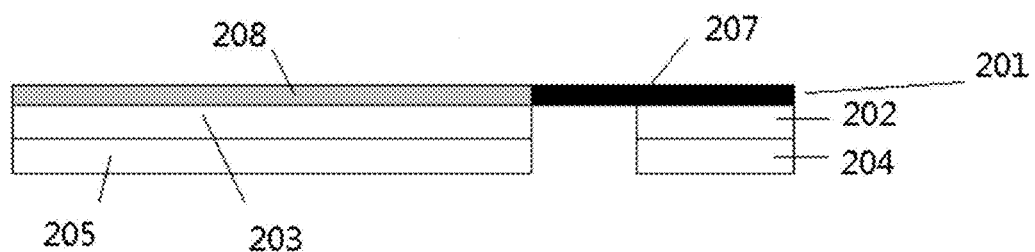
FIG. 3 shows an exemplary embodiment of a flexible display device according to the present disclosure.

FIG. 2 and FIG. 3 further illustrate the back film and the display device of the present disclosure.

FIG. 2 shows an exemplary embodiment of a back film product (10) according to the present disclosure.

The back film (10) comprises:
a release layer (101); and
a first base layer (104) bounded on the release layer (101) via a transparent first adhesive layer (102), and a second base layer (105) bounded on the release layer (101) via a second adhesive layer (103), wherein there is a gap between orthographic projections of the first base material layer (104) and the second base material layer (105) on the release layer (101);
wherein,
the first base material layer (104) has a transmittance of 85% or more and a haze of 5% or less; and
the second base material is different from the first base material.

The back film has a release layer (101) as a base. On one hand, the release layer (101) provides a connection for the first and second adhesive layers (102, 103) with a gap and the first and second base material layers (104, 105) with a gap, thereby making the back film to be an integrated product. On the other hand, the release layer (101) protects the surfaces of the first and second adhesive layers (102, 103) before they are bounded to the flexible display panel. In use, the release layer (101) is peeled off, and the first and second base material layers (104, 105) are bounded to the back surface of the flexible display panel respectively via the first and second adhesive layers (102, 103). Preferably, the release layer has a degree of strength, which is advantageous for maintaining the gap between the first and second base material layers in use and binding. The release layer may be prepared by coating a conventional polymer film base material coated with a release agent, for example, by treating a PET base material with a release agent.

The first base material layer (104) and the second base material layer (105) are bounded on the release layer (101) respectively via the first and second adhesive layers (102, 103). The first and second adhesive layers (102, 103) are adjacent to the release layer (101), may be formed from the same adhesive or different adhesives, and may have substantially the same thickness, as long as the first adhesive is a transparent adhesive. There may also be a gap between the first and second adhesive layers (102, 103). The first and second adhesive layers (102, 103) bind the first base material layer (104) and the second base material layer (105) respectively, wherein the transparent first adhesive layer (102) binds the first base material layer (104), and the second adhesive layer (103) binds the second base material layer (105). There is a gap between the first base material layer (104) and the second base material layer (105). The first base material layer (104) and the second base material layer (105) may have the same pattern as the first and second adhesive layers (102, 103) respectively. Therefore, the gap between the first base material layer (104) and the second base material layer (105) is the same as the gap between the first and second adhesive layers (102, 103). The gap between the first base material layer (104) and the second base material layer (105) is so that the bonding region can be folded without resulting in fracture of the back supporting film.

FIG. 3 shows an exemplary embodiment of a flexible display device according to the present disclosure.

The flexible display device comprises a flexible display panel (201) and a back supporting film bound to a back surface of the flexible display panel, the flexible display panel (201) comprising a bonding region (207) and a non-bonding region (208); wherein the back supporting film comprises: a first base material layer (204) bound to the flexible display panel (201) in at least a portion of the bonding region (207), and a second base material layer (205) bound to the flexible display panel (201) in at least a portion of the non-bonding region (208),
wherein the first base material layer (204) is bound to the flexible display panel (201) via a transparent first adhesive layer (202), and the first base material layer has a transmittance of 85% or more and a haze of 5% or less, and
wherein the second base material layer (205) is bound to the flexible display panel (201) via a second adhesive layer (203), wherein the second base material is different from the first base material.

The first base material layer (204) is advantageous for the AOI of the bonding region (207), and the second base material layer (205) provides better bending resistance and resilience for the non-bonding region (208). 202 and 203 are the first and second adhesive layers respectively. Components 202-205 may be identical to components 102-105 in FIG. 2. That is, the material and geometric feature for the back supporting film of the flexible display device in FIG. 3 may be the same as those of the back film in FIG. 2.

The present disclosure also provides a method for preparing a flexible display device. The flexible display device of the present disclosure may be prepared by the preparation method. The preparation method comprises:
providing the flexible display panel;
removing the release layer from the back film of the present disclosure to expose the first and second adhesive layers; and
binding the first and second adhesive layers of the back film to the back surface of the flexible display panel, so that the flexible display panel is bound to the first base material layer in at least a portion of the bonding region, and is bound to the second base material layer in at least a portion of the non-bonding region.

Because there is a gap between the first base material and the second base material, and it is difficult to maintain the gap between the first base material layer and the second base material layer if the binding is performed after the release layer is completely peeled off, the method for preparing a flexible display device of the present disclosure is performed by performing binding while removing the release layer. For example, the release layer on the adhesive layers at the first base material layer and the second base material layer is first partially peeled off, and then the exposed adhesive layers are bounded to appropriate regions of the back surface of the display panel. When the release layer has a degree of rigidity, the gap between the first base material layer and the second base material layer may be easily maintained. Subsequently, the back supporting film is bounded to the back surface of the display panel while peeling off the release layer, finally forming the display device.

Figure 5:
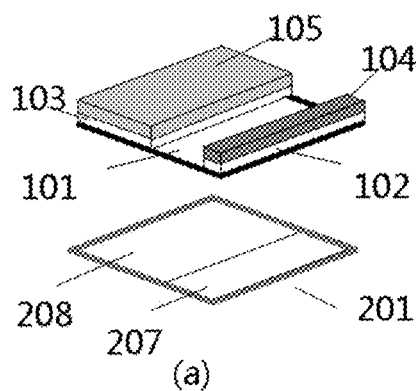
FIG. 5 schematically shows an exemplary flow process for attaching a back supporting film on a flexible display device according to the present disclosure.
Figure 5:
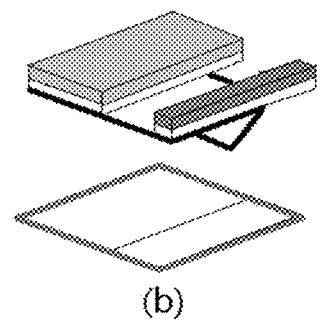
Figure 5:
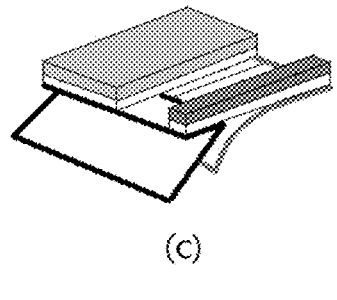
Figure 5:
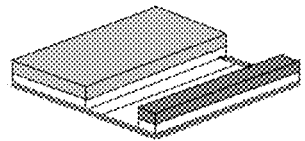

FIG. 5 schematically shows an exemplary flow process for forming a flexible display device with a back film. As shown in FIG. 5a, an upper back film is bounded to a lower flexible display panel 201 to form a flexible display device. The back film comprises adhesive layers 102, 103 and first and second base material layers 104, 105 as shown in FIG. 2. The flexible display panel comprises a bonding region 207 and a non-bonding region 208 as shown in FIG. 3. First of all, as shown in FIG. 5b, the release layer 101 at a distal end is peeled off to expose the distal ends of the adhesive layers 102, 103, but maintaining the release layer 101 and the adhesive layers 102, 103 at the proximal ends not separated.

As shown in FIG. 5c, the distal ends of the adhesive layers 102, 103 are bounded to the distal end of the flexible display panel 201. Subsequently, the release layer 101 is peeled off from the distal end towards the proximal end, while the continuously exposed adhesive layers are bounded to the flexible display panel 201. Finally, as shown in FIG. 5d, the release layer 101 is completely peeled off from the proximal end, and the adhesive layers are bounded to the flexible display panel 201, forming the flexible display device.

The present disclosure also provides a method for preparing the back film of the present disclosure. The back film of the present disclosure contains two kinds of base materials, and there is a gap between those two kinds of base materials. Therefore, there is a need for a unique preparation method. The preparation method of the present disclosure comprises:

- positioning the first base material and the second base material on a carrier film, so that there is an empty region remained between the first base material and the second base material, wherein the empty region has a width less than a predetermined width of the gap;
- overlaying the first adhesive and the second adhesive on the first base material and the second material respectively to form the adhesive layers;
- overlaying the release layer on the adhesive layers;
- removing the carrier film;
- cutting off a portion of the first base material and/or a portion of the second base material at an edge of the empty region to form the gap meeting the requirement for the predetermined width.

Optionally, a peripheral cutting off may be carried out to obtain a back film with a desired outer size. A plurality of back films may be prepared on a large-area carrier film in an array, and individual back films may be obtained by cutting. The film layers in the back film may be stacked in a roll-to-roll manner.

The preparation method of the back film according to the present disclosure will be described below with reference to FIG. 4.

As shown in FIG. 4a, a temporary carrier film (109) is used for the preparation in the preparation method of the back film according to the present disclosure. The first base material (104) and the second base material (105) are positioned on the carrier film, as shown in FIG. 4b. Such a carrier film may spontaneously generate an electrostatic adherence to other films. The electrostatic adherence can adhere the first base material such as PET and the second base material such as PI onto the carrier film. The advantage of the electrostatic adherence lies in easy peeling off, while providing some fixing. A conventional PET film may be used as the material for the carrier film.

Figure 4:
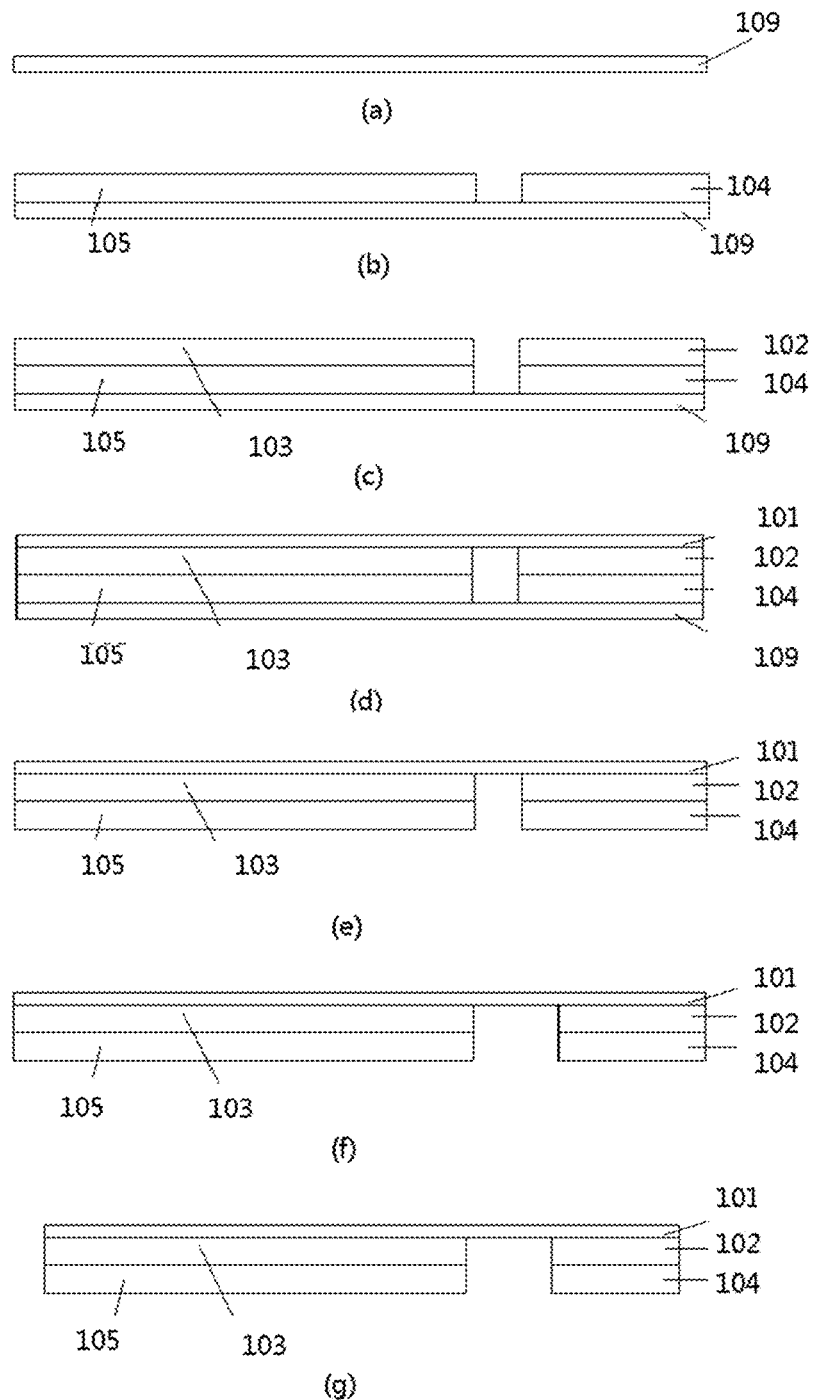
FIG. 4 shows an exemplary flow process for an embodiment of the preparation of the back film according to the present disclosure.

FIG. 4 schematically shows a carrier film with a planar shape. The carrier film may have a large area, preferably in the form of a roll, so as to facilitate a roll-to-roll process, and may be used for mass production. FIG. 4 schematically shows only one piece of the first base material and one piece of the second base material. Multiple pieces of base materials may be adhered on the carrier film, and the first base material and the second base material may be alternately positioned, so that it is possible to prepare multiple pieces of back films in one step, and individual back films may be obtained by cutting in subsequent steps. All the steps such as adhesive coating and film overlaying as described later may be carried out continuously in a roll-to-roll manner.

There remains an empty region between the first base material and the second base material. In other words, there remains a gap between the first base material and the second base material to prevent them from contacting and interfering with each other. The empty region has a width less than the gap to be achieved by cutting subsequently. As such, a margin is remained for the subsequent finishing of the first base material and the second base material.

Subsequently, as shown in FIG. 4c, first and second adhesive layers (102, 103) are formed on the first base material and the second base material respectively. The process for forming the adhesive layers may be a coating process. The coating is performed on the upper surfaces of the base materials. The adhesives may both be an acrylic adhesive material, and the range for coating thickness may be selected as appropriate. In the present embodiment, the first and second base material layers have the same thickness, and therefore the first and second adhesives also have the same thickness. The first and second adhesives may be from the same roll of adhesive material to achieve integrated adhesive coating. The adhesive coating may also be performed separately.

Subsequently, a release layer (101) is overlaid on the adhesive layer (FIG. 4d), and the carrier film (109) is removed (FIG. 4e). When the release layer binds the two kinds of base materials together via the adhesive layers, the carrier film may be easily removed.

Subsequently, a cutting off may be performed. As shown in FIG. 4f, the base materials and the adhesive layers at an edge of the empty region are first cut off to form a desired gap. Preferably, only the first base material and the first adhesive layer are cut off, because the first base material has a lower strength and thus is readily to be cut off. Nevertheless, the second base material or both base materials may be cut off, as long as the desired gap is formed finally. In the cutting off here, the release layer will not be cut off, and only the portions of the base materials and the adhesives are cut off.

Finally, a peripheral cutting off is performed if needed, as shown in FIG. 4g, to obtain a back film with a desired size.

A back film can be conveniently and accurately formed by the method for preparing a back film according to the present disclosure.

The present disclosure will be further described below with reference to the following example.

Example 1

The Preparation of a Back Film

A pure PET film was used as a carrier film, and the back film was prepared according to the process as shown in FIG. 4. As shown in FIGS. 4a and 4b, a first base material layer and a second base material layer both having a thickness of 50 μm were adhered on the PET carrier film by spreading, so that the empty region therebetween had a width of 0.5 mm. The first base material was PET, and had a transmittance of 90%. The second base material was polyimide, and had a transmittance of 20%. Subsequently, as shown in FIG. 4c, an acrylic adhesive was coated onto the base material layers in a roll-to-roll manner with a thickness of 10 μm. That is, both the first adhesive layer and the second adhesive layer were acrylic adhesive.

Next, a release layer obtained by treating a PET base material with a release agent was overlaid on the adhesive layers. Subsequently, the carrier film was peeled off.

Next, a portion of the first base material and a portion of the adhesive layer on one side of the empty region were cut off by die cutting to obtain a gap with a width of 3 mm.

Finally, a peripheral cutting off was performed to obtain the back film.

Example 2

The Preparation of the Flexible Display Device

As shown in FIG. 5, the back film of Example 1 was bounded onto the back surface of a flexible display panel without any back protective film while peeling off the release layer from the back film, wherein the first base material layer was located in the bonding region, the second base material layer was located in the non-bonding region, and the gap was located in the bonding region.

AOI may be successfully performed on the flexible display device prepared, and the flexible display device had good bending resistance and resilience in the non-bonding region or in the display area.

Obviously, modifications and variations on the embodiments of the present disclosure can be made by those skilled in the art without departing from the spirit and scope of the present application. As such, if these modifications and variations fall within the scopes of the claims of the present application or equivalents thereof, the present application is intended to encompass these modifications and variations.

The invention claimed is:

1. A back film for a flexible display device, comprising: a release layer; and
a first base material layer bounded on the release layer via a transparent first adhesive layer, and a second base material layer bounded on the release layer via a second adhesive layer, wherein there is a gap between orthographic projections of the first base material layer and the second base material layer on the release layer;
wherein,
the first base material layer has a transmittance of 85% or more and a haze of 5% or less;
the second base material is different from the first base material;
the second base material has an elastic modulus and/or a breaking strength greater than those of the first base material; and
the first adhesive has an elastic modulus greater than that of the second adhesive.

2. The back film according to claim 1, wherein, the second base material layer has an unrecoverable angle after being folded in half of 60° or less.

3. The back film according to claim 1, wherein, the second base material layer has a transmittance of less than 85% and a haze of more than 5%.

4. The back film according to claim 1, wherein, the first base material has a glass transition temperature of 150° C. or higher.

5. The back film according to claim 1, wherein, the first base material is polyethylene terephthalate, and the second base material is polyimide or stainless steel.

6. A preparation method of the back film of claim 1, comprising:
positioning the first base material and the second base material on a carrier film, so that there is an empty region remaining between the first base material and the second base material, wherein the empty region has a width less than that of the gap;
overlaying the first adhesive and the second adhesive on the first base material and the second material respectively to form the adhesive layers;
overlaying the release layer on the adhesive layers;
removing the carrier film; and
cutting off the first base material and/or the second base material at an edge of the empty region to form the gap.

7. A flexible display device, comprising a flexible display panel and a back supporting film bound to a back surface of the flexible display panel, wherein the flexible display panel comprises a bonding region and a non-bonding region, wherein
the back supporting film comprises: a first base material layer bound to the flexible display panel in at least a portion of the bonding region, and a second base material layer bound to the flexible display panel in at least a portion of the non-bonding region,
wherein the first base material layer is bound to the flexible display panel via a transparent first adhesive layer, the first base material layer has a transmittance of 85% or more and a haze of 5% or less,
wherein the second base material layer is bound to the flexible display panel via a second adhesive layer, wherein the second base material is different from the first base material,
wherein the second base material has an elastic modulus and/or a breaking strength greater than those of the first base material, and
wherein the first adhesive has an elastic modulus greater than that of the second adhesive.

8. The flexible display device according to claim 7, wherein,
the second base material layer has an unrecoverable angle after being folded in half of 60° or less.

9. The flexible display device according to claim 7, wherein,
the second base material layer has a transmittance of less than 85% and a haze of more than 5%.

10. The flexible display device according to claim 7, wherein,
the first base material has a glass transition temperature of 150° C. or higher.

11. The flexible display device according to claim 7, wherein,
the first base material is polyethylene terephthalate, and the second base material is polyimide or stainless steel.

* * * * *